United States Patent
Hopper et al.

(10) Patent No.: US 7,057,174 B1
(45) Date of Patent: *Jun. 6, 2006

(54) HIGH-SPEED PHOTON DETECTOR AND METHOD OF FORMING THE DETECTOR

(75) Inventors: Peter J. Hopper, San Jose, CA (US); Philipp Lindorfer, San Jose, CA (US); Vladislav Vashchenko, Palo Alto, CA (US); Michael Mian, Livermore, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 274 days.

This patent is subject to a terminal disclaimer.

(21) Appl. No.: 10/355,904

(22) Filed: Jan. 30, 2003

(51) Int. Cl.
*H01L 31/00* (2006.01)

(52) U.S. Cl. .................... 250/338.4; 257/225
(58) Field of Classification Search ............ 250/338.4; 257/225
See application file for complete search history.

(56) References Cited

U.S. PATENT DOCUMENTS 6,855,968 B1 * 2/2005 Hopper et al. .............. 257/225

OTHER PUBLICATIONS

Eddy Currents. [online]. [Retrieved on Dec. 1, 2002]. Retrieved from the Internet: <URL: www.ac.wwu.edu/vawter/PhysicsNet/Tropics/Inductance/EddyCurrents.html>, pps 1-2.
What is Eddy Current Testing?-B.P.C. Rao [online]. [Retrieved on Dec. 1, 2002]. Retrieved from the Internet: <URL: www.geocities.com/raobpc/ED-Def>, pps. 1-6.

* cited by examiner

*Primary Examiner*—David Porta
*Assistant Examiner*—Shun Lee
(74) *Attorney, Agent, or Firm*—Mark C. Pickering

(57) ABSTRACT

A photon detector capable of detecting gigahertz frequency optical signals utilizes a layer of photonic material that is formed adjacent to the coil of an inductor. When a pulsed light source is applied to the layer of photonic material, the photonic material generates eddy currents that alter the magnetic flux of the inductor. The signals can then be detected by detecting the change in the magnetic flux.

21 Claims, 9 Drawing Sheets

HIGH-SPEED PHOTON DETECTOR AND METHOD OF FORMING THE DETECTOR

RELATED APPLICATION

The present application is related to application Ser. No. 10/356,423 for "High-Speed Photon Detector and No Cost Method of Forming the Detector" by Peter Hopper et al. filed on an even date herewith, now U.S. Pat. No. 6,855,968 B1 issued on Feb. 15, 2005.

DETAILED DESCRIPTION OF THE INVENTION

Figure 1A:
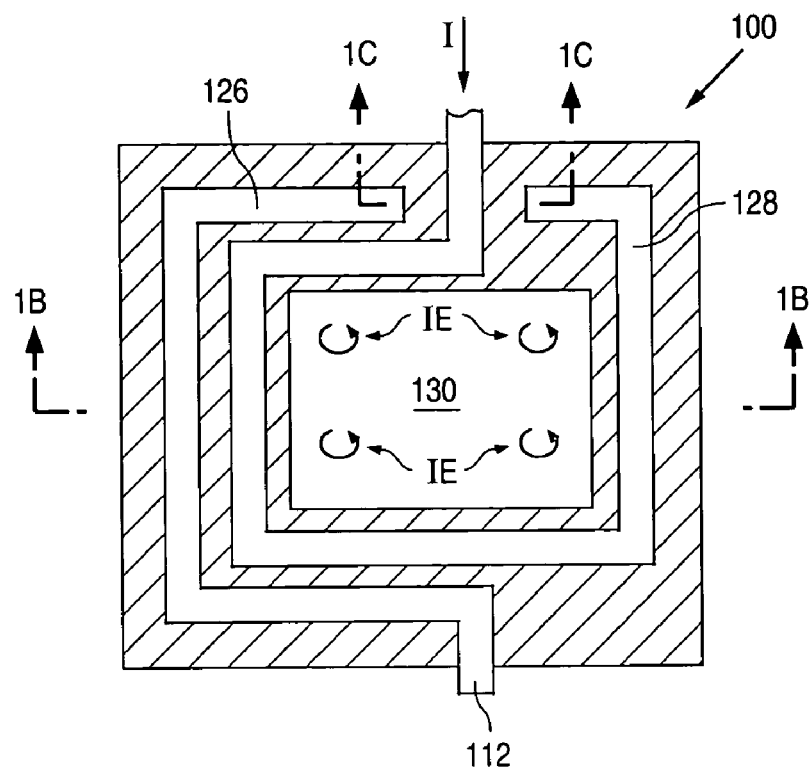
FIGS. 1A–1C are views illustrating an example of a high-speed photon detector 100 in accordance with the present invention.
Figure 1B:
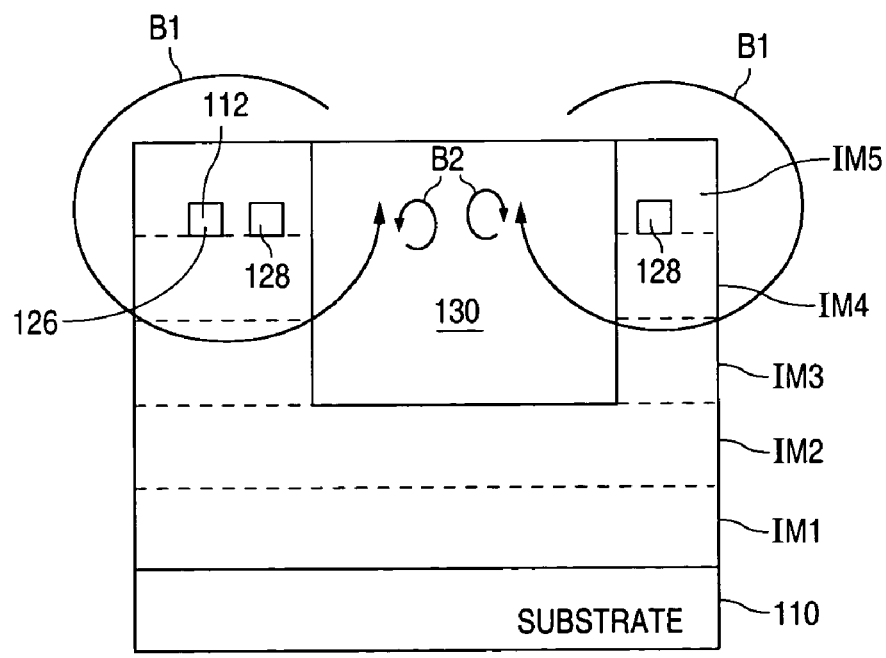
Figure 1C:
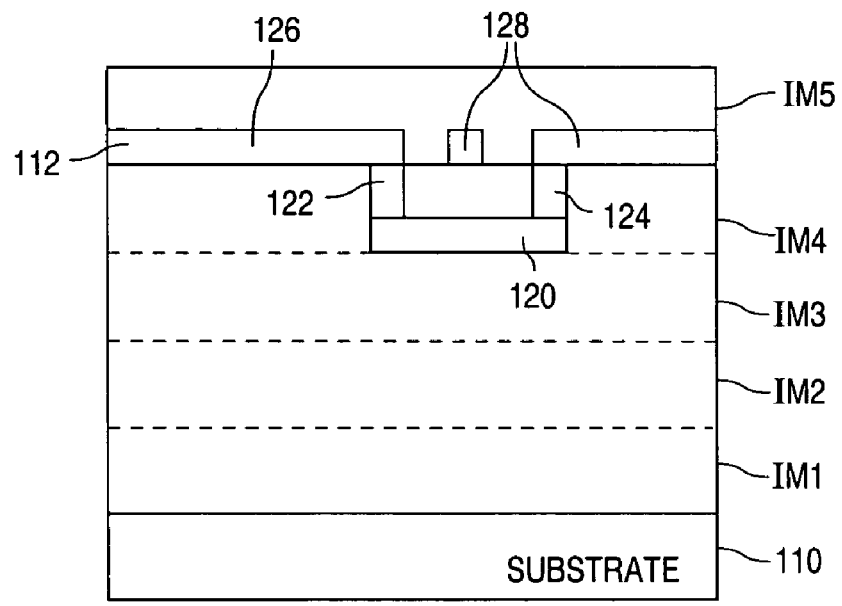

FIGS. 1A–1C show views that illustrate an example of a high-speed photon detector 100 in accordance with the present invention. FIG. 1A shows a plan view, while FIGS. 1B and 1C show cross-sectional views taken along lines 1B—1B and 1C—1C, respectively, of FIG. 1A.

As shown in FIGS. 1B and 1C, detector 100, which is formed on a region of semiconductor material 110, such as a p-type or n-type substrate or well, includes a number of layers of isolation material IM that are formed over material 110. Semiconductor material 110 can include, for example, an overlying layer of field oxide. In the example shown in FIGS. 1A–1C, detector 100 includes five layers of isolation material IM1–IM5 which, in turn, support a four metal layer process.

Further, detector 100 also includes a planar (watch spring) inductor 112 that is formed in and on isolation layers IM3–IM5. (Other inductor structures can alternately be used.) Inductor 112 includes a lower metal trace 120 that is formed on isolation layer IM3, and a pair of vias 122 and 124 that are formed through isolation layer IM4 to make an electrical connection with the opposite ends of lower metal trace 120.

In addition, inductor 112 includes a first upper metal trace 126 that is formed on the top surface of isolation layer IM4 to make an electrical connection with via 122, and a second upper metal trace 128 that is formed on the top surface of isolation layer IM4 to make an electrical connection with via 124.

Lower metal trace 120 can be formed from any metal trace, while upper metal traces 126 and 128 can be formed from any overlying metal trace. In the FIG. 1 example, lower metal trace 120 is formed from a third layer of metal (metal-3), while upper metal traces 126 and 128 are formed from a fourth layer of metal (metal-4).

As further shown in FIGS. 1A–1C, detector 100 also includes a layer of photonic material 130 which is formed in and on the layers of isolation material IM. Photonic layer 130, which can be implemented with, for example, undoped polysilicon, silicon germanium, or damaged single crystal silicon, generates a large number of charge carriers when light strikes layer 130, and has a high recombination rate so that the carriers recombine quickly when light no longer strikes layer 130. (Single crystal silicon can be damaged by, for example, radiating the silicon with neutrons.)

Photonic material 130 generates more electron-hole pairs than the surrounding layers of isolation material IM when struck by light, and has a higher recombination rate than material 110 when no longer struck by light. In the example shown in FIGS. 1A–1C, photonic layer 130 is formed on the top surface of isolation layer IM2, and is laterally surrounded by isolation layers IM3–IM5.

Photonic layer 130 is ideally thick enough to capture all of the photons of a wavelength of light, or within a band of light, that strikes layer 130. For example, substantially all of the infra-red (IR) photons (e.g., 850 nM) can be captured when layer 130 is about three to four microns thick. However, as described in greater detail below, the thickness of photonic layer 130 need not capture all of the photons. For example, at a thickness of approximately two microns, layer 130 captures about 60% of the IR photons. (A thin layer of photonic material can be used with a two metal layer process.)

In operation, a periodic AC voltage waveform is placed on planar inductor 112 so that a current I flows through inductor 112. As shown in FIG. 1B, the periodic AC voltage creates a pulsating magnetic field B1 that is normal to the plane of inductor 112 (vertical and oriented out of the page in FIG. 1A).

The pulsating magnetic field B1 creates a pulsating magnetic flux that induces pulsating eddy currents IE in photonic layer 130. As shown in FIG. 1A, the eddy currents IE are small loops of current that exist only in photonic layer 130. The eddy currents IE are normal to the magnetic field B1, and are parallel with the plane of inductor 112.

The pulsating eddy currents IE also create a pulsating magnetic field B2 that is normal to the plane of photonic layer 130 (vertical and oriented into of the page in FIG. 1A). The pulsating magnetic field B2 creates a pulsating magnetic flux that opposes the magnetic flux generated by magnetic field B1. The magnetic field B2 generated by the eddy currents is smaller than the magnetic field B1 generated by the AC voltage waveform. As a result, the eddy currents reduce the magnetic flux generated by the AC voltage waveform.

In the present invention, the impedance of inductor 112, which is a function of the magnetic flux, is continually measured or sampled using conventional circuitry. When no light is incident on photonic layer 130, the impedance of inductor 112 has a first value that is defined by the physical characteristics of inductor 112 and layer 130.

On the other hand, when light is incident on photonic layer 130, the light striking photonic layer 130 and generates a large number of electron-hole pairs. The free electrons increase the magnitudes of the periodic eddy currents IE which, in turn, increases the magnitude of the pulsating magnetic field B2.

The increased magnitude of the pulsating magnetic field B2 reduces the net pulsating magnetic flux which, in turn, changes the impedance of inductor 112. Thus, by detecting the change in the impedance of inductor 112, the presence or absence of light incident on photonic layer 130 can be detected. (Other changing characteristics besides the impedance of inductor 112 that are a function of the magnetic field or flux can alternately be used to detect the presence or absence of light incident on poly layer 130.)

As noted above, one of the characteristics of photonic layer 130 is that layer 130 has a fairly high recombination rate. As a result, when the light is pulsed off, the charge carriers recombine quickly which, in turn, causes the impedance of inductor 112 to change quickly.

On the other hand, pure silicon, such as a substrate or well material, has a lower recombination rate which, in turn, means that photo-generated charge carriers can be present well after the light has been pulsed off. Thus, when the thickness of layer 130 is not thick enough to capture all of the photons of a wavelength of light, or within a band of light, that strikes layer 130, the photons passing through layer 130 form photo-generated charge carriers in material 110 that have a longer lifetime.

The longer-lifetime photo-generated charge carriers in material 110 continue to effect the magnetic flux and, therefore, the impedance of inductor 112, after the light has been pulsed off. Thus, if sufficient numbers of photons pass through layer 130, false readings can result.

One of the advantages of the present invention is that pulsed gigahertz frequency optical signals can be detected. One of the limitations of conventional photodiodes is that the transit time of the charge carriers is typically too long for pulsed gigahertz frequency optical signals.

With conventional photodiodes, photons generate electron-hole pairs. The electrons are then typically collected at a sense point. Thus, if a pulsed light source is applied to a photodiode, the photodiode must be able to generate and collect the electrons from one light pulse before the next light pulse begins.

In the present invention, the photo-generated charge carriers do not need to be collected by a sense point. In less time than it takes for the charge carriers to be collected by the sense point of a photodiode, the charge carriers in photonic layer 130 change the magnetic flux which, in turn, changes the impedance of inductor 112. Thus, by continually monitoring or sampling the impedance of inductor 112, gigahertz frequency optical signals can be detected.

Another of the advantages of the present invention is that detector 100 can be formed in a standard silicon-based semiconductor fabrication process with the addition of one mask step. FIGS. 2A–2D show views that illustrate an example of a method of forming a photon detector in accordance with the present invention.

Figure 2A:
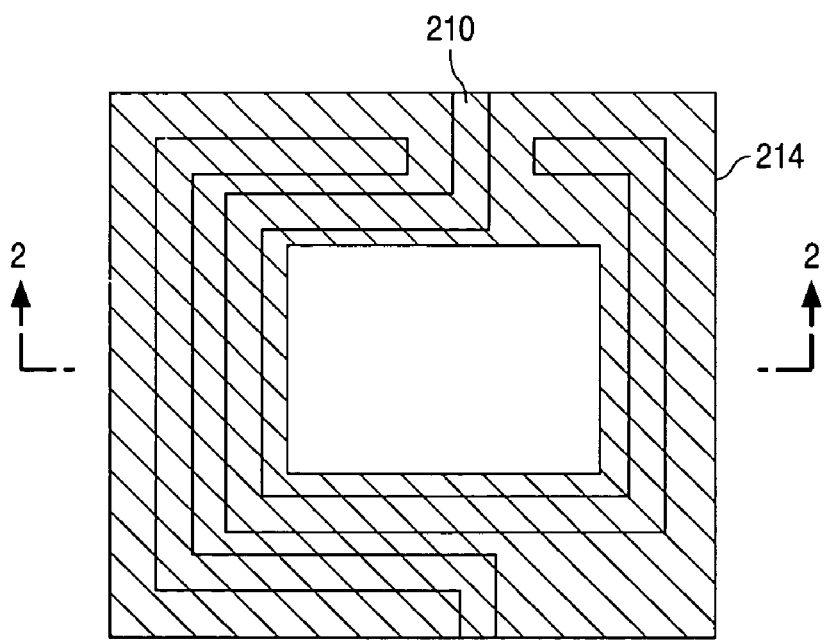
FIGS. 2A–2D are views illustrating an example of a method of forming a photon detector in accordance with the present invention.
Figure 2B:
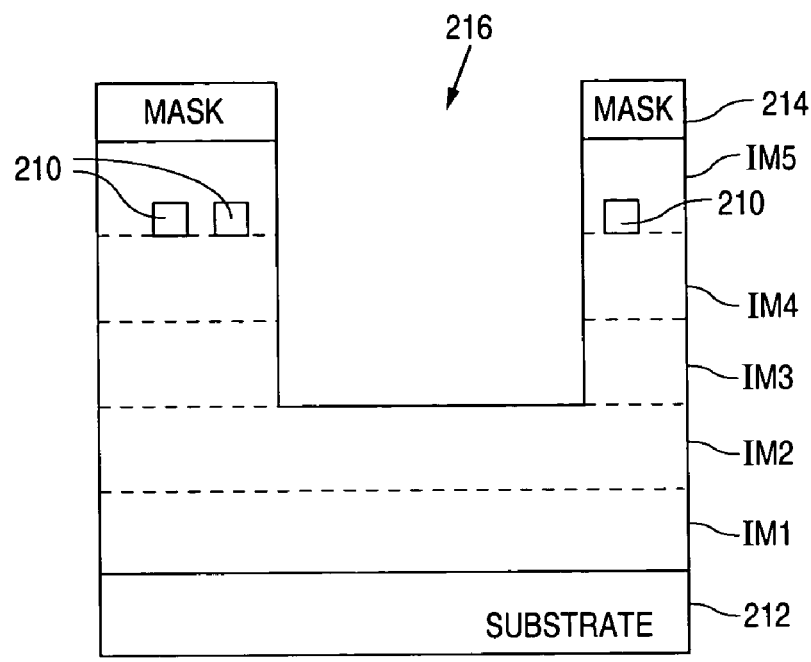
Figure 2C:
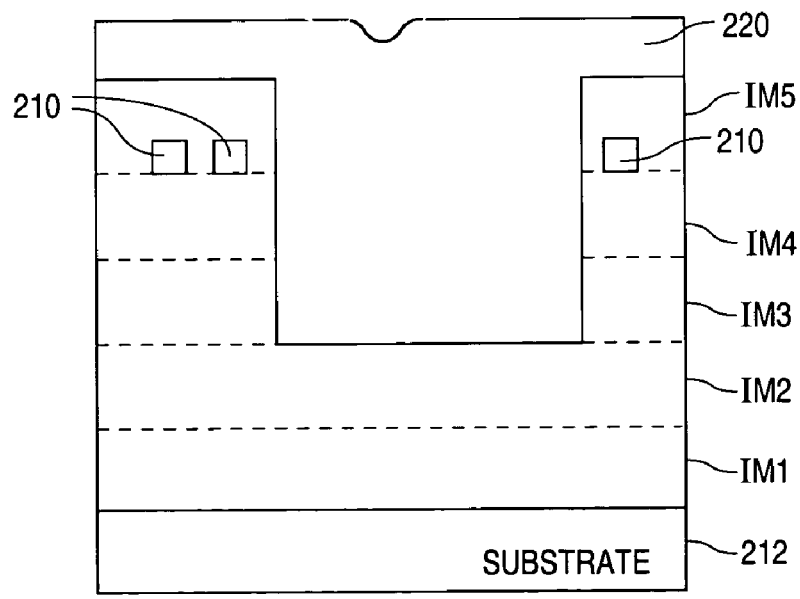
Figure 2D:
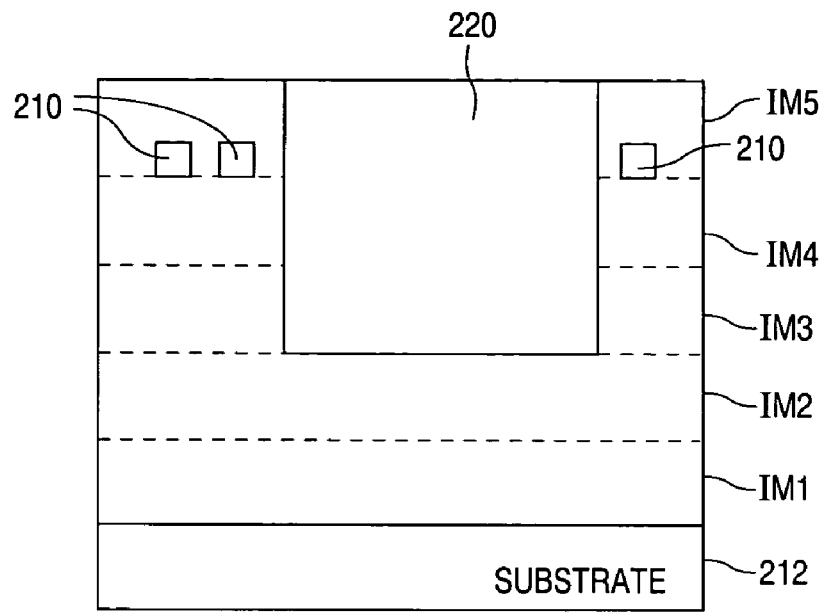

FIG. 2A shows a plan view, while FIGS. 2B–2D shows cross-sectional views taken along line 2—2 of FIG. 2A. The method utilizes conventional steps to form a planar inductor 210 as part of a metal interconnect structure that includes a number of isolation layers IM1–IM5 that are formed over a semiconductor material 212, such as a p-type or n-type substrate or well (which can include an overlying layer of field oxide). Inductor 210 can be formed to have the same structure as inductor 112.

As shown in FIGS. 2A and 2B, the method begins by forming and patterning a mask 214 on the top surface of isolation layer IM5. Following this, isolation layer IM5 and a number of underlying isolation layers, IM4 and IM3 in this example, are etched to form an opening 216 in the center of inductor 210 inside the coil. Mask 214 is then removed.

Next, as shown in FIG. 2C, a layer of photonic material 220, such a layer of undoped polysilicon, silicon germanium, or damaged single crystal silicon, is formed to fill up opening 216. Once photonic layer 220 has been formed, as shown in FIG. 2D, photonic layer 220 is planarized until photonic layer 220 has been removed from the top surface of isolation layer IM5.

Following this, the method continues with conventional steps. The above-described steps can be formed by modifying existing masks, and the addition of masking step 214. As a result, the detector can be formed with one additional masking step.

Figure 3:
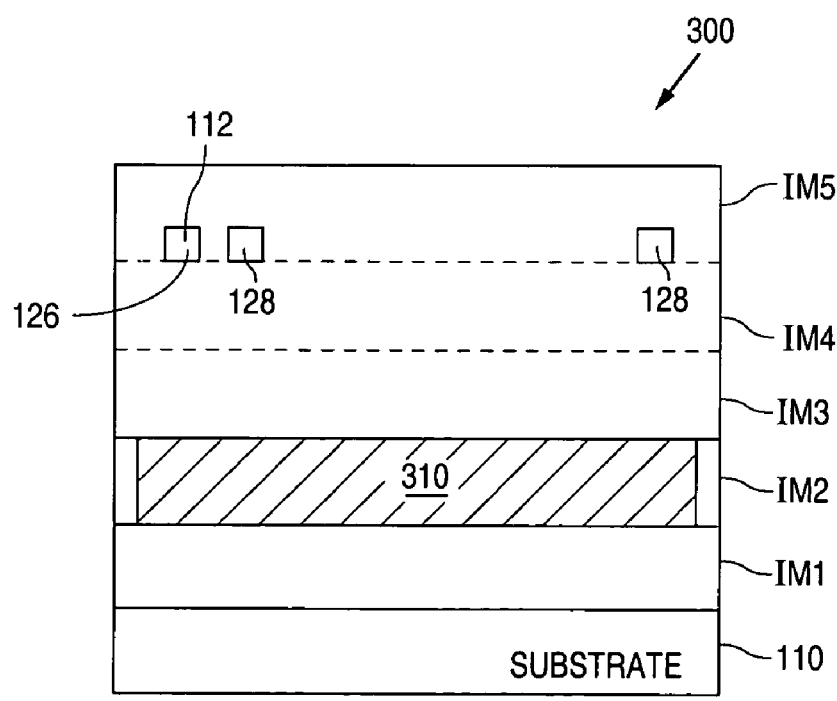
FIG. 3 is a cross-sectional view illustrating an example of a photon detector 300 in accordance with an alternate embodiment of the present invention.

FIG. 3 is a cross-sectional view that illustrates an example of a photon detector 300 in accordance with an alternate embodiment of the present invention. Detector 300 is similar to detector 100 and, as a result, utilizes the same reference numerals to designate the structures which are common to both detectors. As shown in FIG. 3, detector 300 differs from detector 100 in that detector 300 has a photonic region 310 that is formed below inductor 112.

Figure 4A:
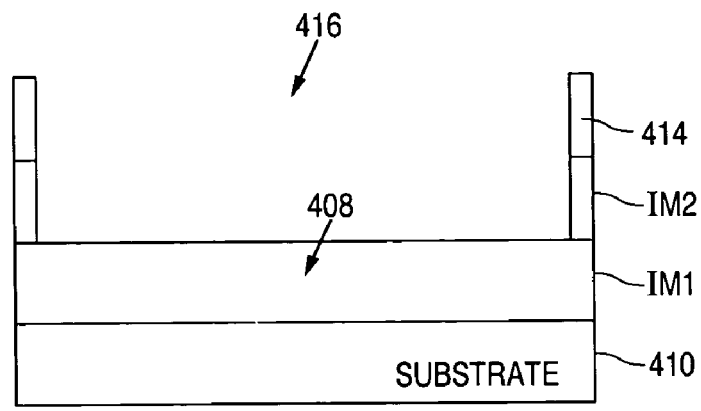
FIGS. 4A–4F are views illustrating an example of a method of forming a photon detector in accordance with the present invention.

FIGS. 4A–4F show views that illustrate an example of a method of forming a photon detector in accordance with the present invention. FIGS. 4A–4D show cross-sectional views. As shown in FIG. 4A, the method begins by forming a first layer of isolation material IM1 over a region 408 of a semiconductor material 410, such as an n-type or p-type substrate or well. Material 410 can include an overlying layer of field oxide.

Following this, a first layer of metal (not shown) is formed on isolation layer IM1, and then patterned to form metal-1 traces (not shown). In this example, although no metal-1 traces are shown, metal-1 traces can be present over region 408. After the metal-1 traces have been formed, a second layer of isolation material IM2 is formed on isolation layer IM1 and the metal-1 traces.

Following this, a second layer of metal (not shown) is formed on isolation layer IM2, and then patterned to form metal-2 traces. In this example, none of the metal-2 traces can be present over region 408. After the metal-2 traces have been formed, a mask 414 is formed on the top surface of isolation layer IM2 and the metal-2 traces. Following this, isolation layer IM2 is etched to form an opening 416. Mask 414 is then removed.

Figure 4B:
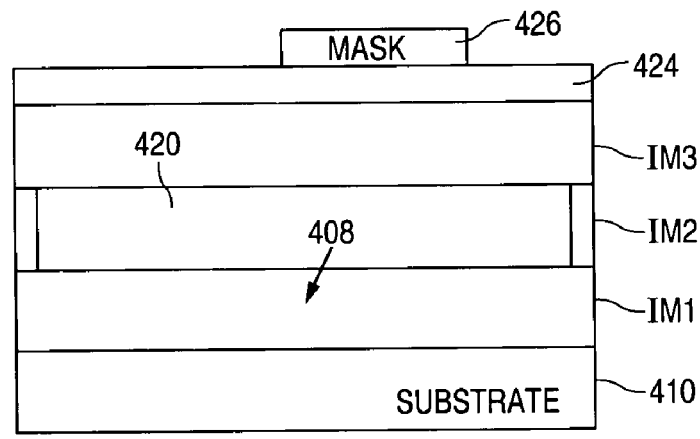

Next, as shown in FIG. 4B, a layer of photonic material, such a layer of undoped polysilicon, silicon germanium, or damaged single crystal silicon, is formed to fill up opening 416. Once the photonic layer has been formed, the photonic layer is planarized until the photonic layer has been removed from the top surface of isolation layer IM2. The planarization forms a photonic region 420, and can be a combination of a chemical-mechanical polishing step followed by an etch back.

Following this, a third layer of isolation material IM3 is formed on isolation layer IM2, the metal-2 traces, and photonic region 420. Once isolation layer IM3 has been formed, a third layer of metal 424 is formed on isolation layer IM3. Next, a mask 426 is formed and patterned.

Figure 4C:
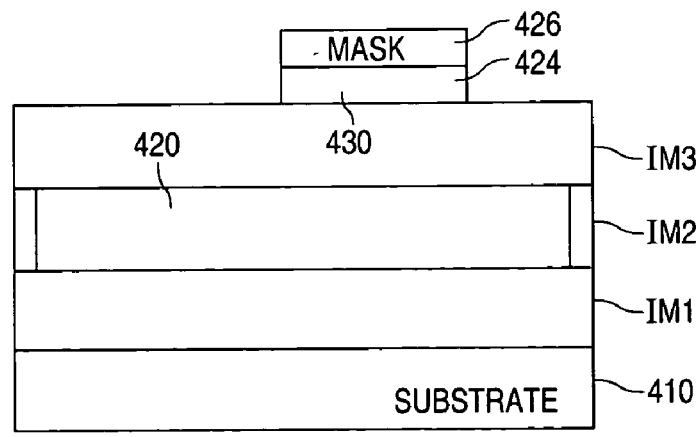
Figure 4D:
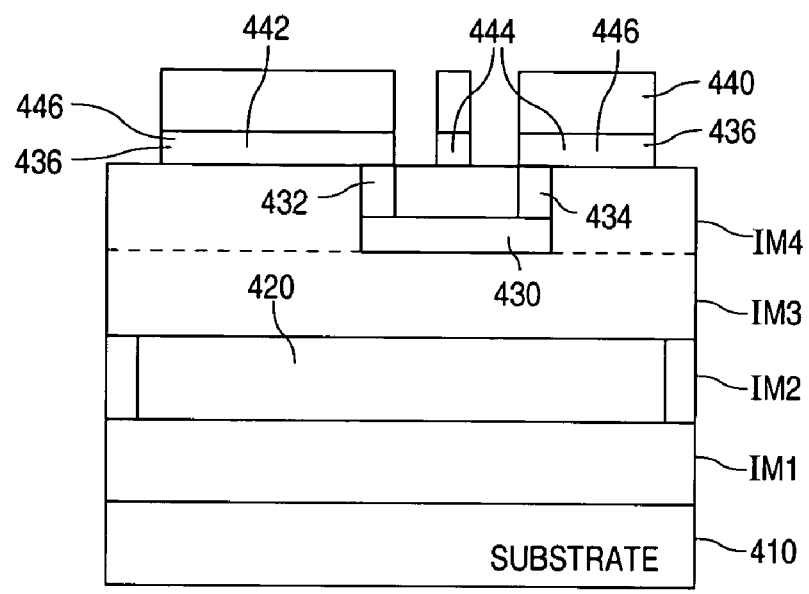

After this, as shown in FIG. 4C, the exposed regions of third metal layer 424 are removed to form metal-3 traces, including a lower trace 430. Mask 426 is then removed. As shown in FIG. 4D, after the metal-3 traces have been formed, a fourth layer of isolation material IM4 is formed on isolation layer IM3 and lower trace 430.

Once isolation layer IM4 has been formed, vias 432 and 434 are formed through isolation layer IM4 to make an electrical connection with opposite ends of lower trace 430 using conventional steps. After this, a fourth layer of metal 436 is formed on isolation layer IM4 to make electrical connection with vias 432 and 434. Next, a mask 440 is formed and patterned.

Figure 4E:
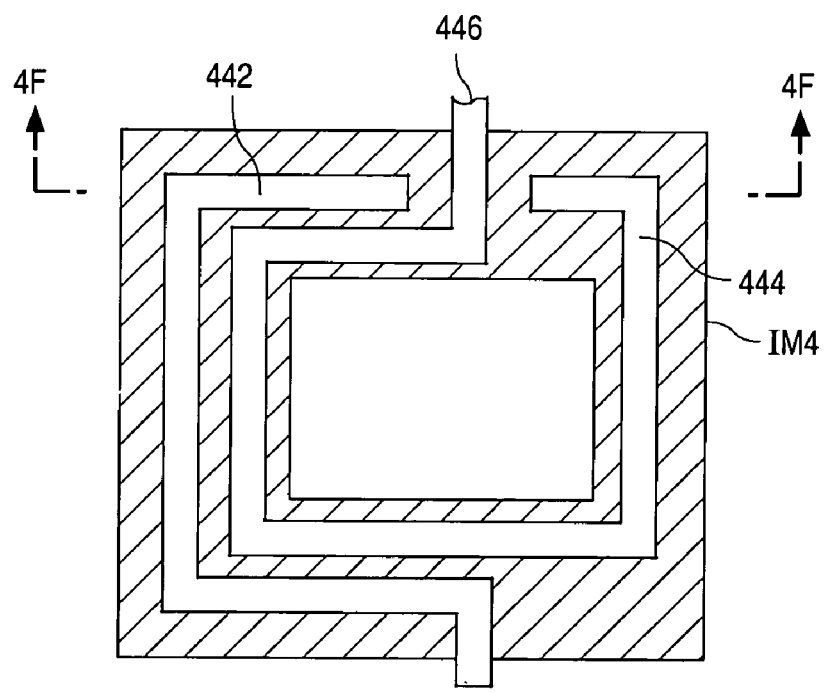

Following this, the exposed regions of fourth metal layer 436 are removed to form metal-4 traces, including a first upper trace 442 and a second upper trace 444. Mask 440 is then removed. FIG. 4E shows a plan view that illustrates the detector following the etch of the fourth metal layer to form traces 442 and 444. As shown in FIG. 4E, the etch forms an inductor 446.

Figure 4F:
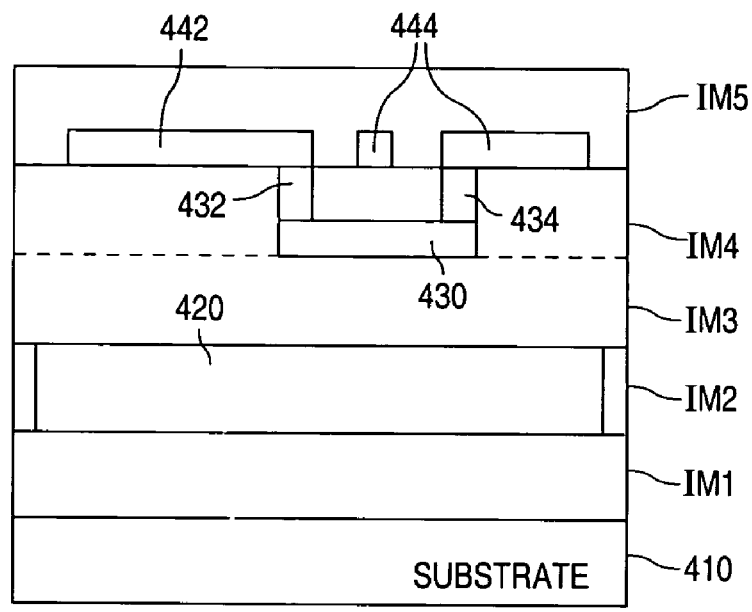

Next, as shown in FIG. 4F, which is a cross-sectional view taken along line 4F—4F of FIG. 4E, a fifth layer of isolation material IM5 is formed on isolation layer IM4 and traces 442 and 444. Following this, the method continues with conventional steps. The above-described steps can be formed by modifying existing masks, and the addition of masking step 414. As a result, the detector can be formed with one additional masking step.

Figure 5:
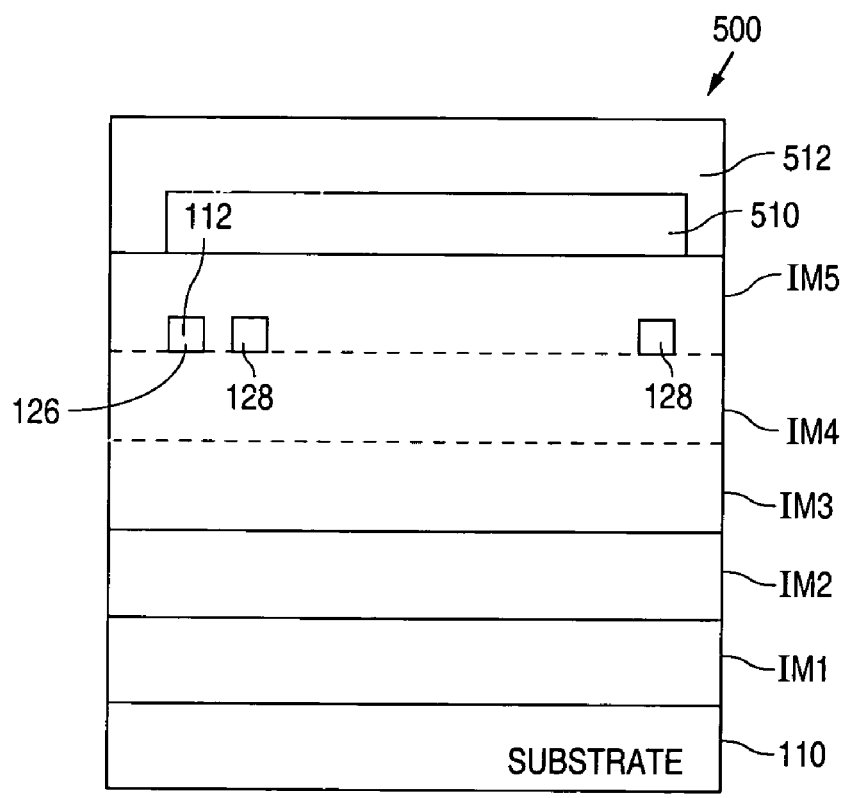
FIG. 5 is a cross-sectional view illustrating an example of a photon detector 500 in accordance with an alternate embodiment of the present invention.

FIG. 5 is a cross-sectional view that illustrates an example of a photon detector 500 in accordance with an alternate embodiment of the present invention. Detector 500 is similar to detector 100 and, as a result, utilizes the same reference numerals to designate the structures which are common to both detectors. As shown in FIG. 5, detector 500 differs from detector 100 in that detector 500 has a photonic region 510 that is formed above inductor 112, and a layer of isolation material 512 that is formed over region 510 and isolation layer IM5.

Figure 6A:
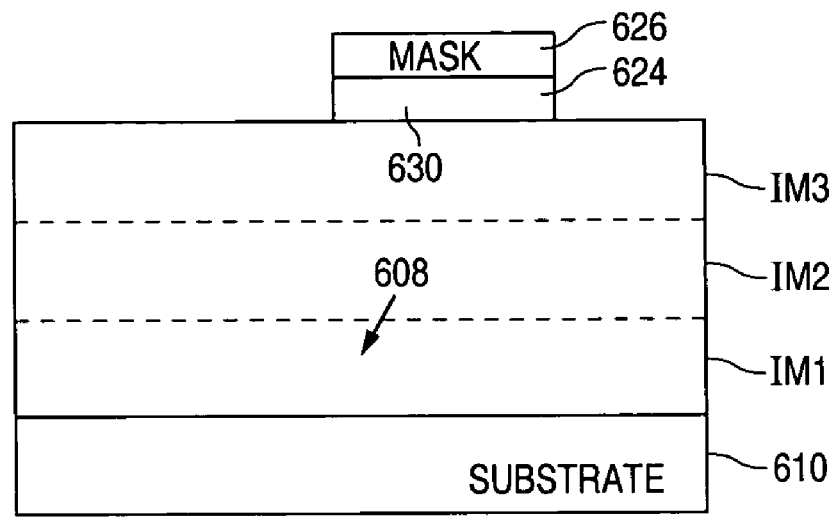
FIGS. 6A–6D are views illustrating an example of a method of forming a photon detector in accordance with the present invention.
Figure 6B:
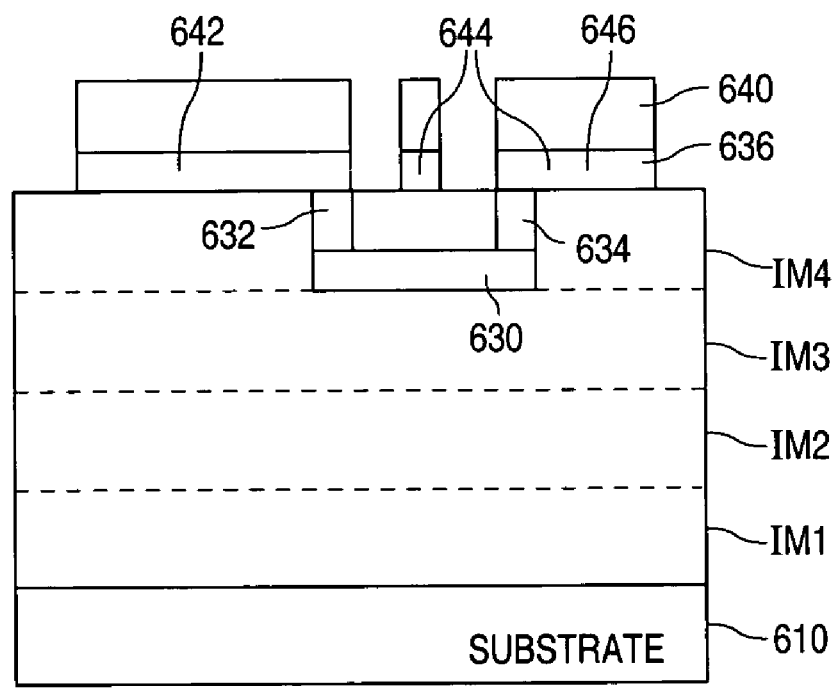

FIGS. 6A–6D show views that illustrate an example of a method of forming a photon detector in accordance with the present invention. FIGS. 6A–6B show cross-sectional views. As shown in FIG. 6A, the method forms a first layer of isolation material IM1 over a region 608 of a semiconductor material 610, such as an n-type or p-type substrate or well. Semiconductor material 610 can include an overlying layer of field oxide.

Following this, a first layer of metal (not shown) is formed on isolation layer IM1, and then patterned to form metal-1 traces (not shown). In this example, although no metal-1 traces are shown, metal-1 traces can be present over region 608. After the metal-1 traces have been formed, a second layer of isolation material IM2 is formed on isolation layer IM1 and the metal-1 traces.

Following this, a second layer of metal (not shown) is formed on isolation layer IM2, and then patterned to form metal-2 traces. In this example, although no metal-2 traces are shown, metal-2 traces can be present over region 608. After the metal-2 traces have been formed, a third layer of isolation material IM3 is formed on isolation layer IM2 and the metal-2 traces. Once isolation layer IM3 has been formed, a third layer of metal 624 is formed on isolation layer IM2. Next, a mask 626 is formed and patterned. After this, the exposed regions of the third metal layer 624 are removed to form metal-3 traces, including a lower trace 630. Mask 626 is then removed.

As shown in FIG. 6B, after the metal-3 traces have been formed, a fourth layer of isolation material IM4 is formed on isolation layer IM3 and lower trace 630. Once isolation layer IM4 has been formed, vias 632 and 634 are formed through isolation layer IM4 to make an electrical connection with opposite ends of lower trace 630 using conventional steps.

After this, a fourth layer of metal 636 is formed on isolation layer IM4 to make electrical connection with vias 632 and 634. Next, a mask 640 is formed and patterned.

Following this, the exposed regions of fourth metal layer 636 are removed to form metal-4 traces, including a first upper trace 642 and a second upper trace 644. Mask 640 is then removed.

Figure 6C:
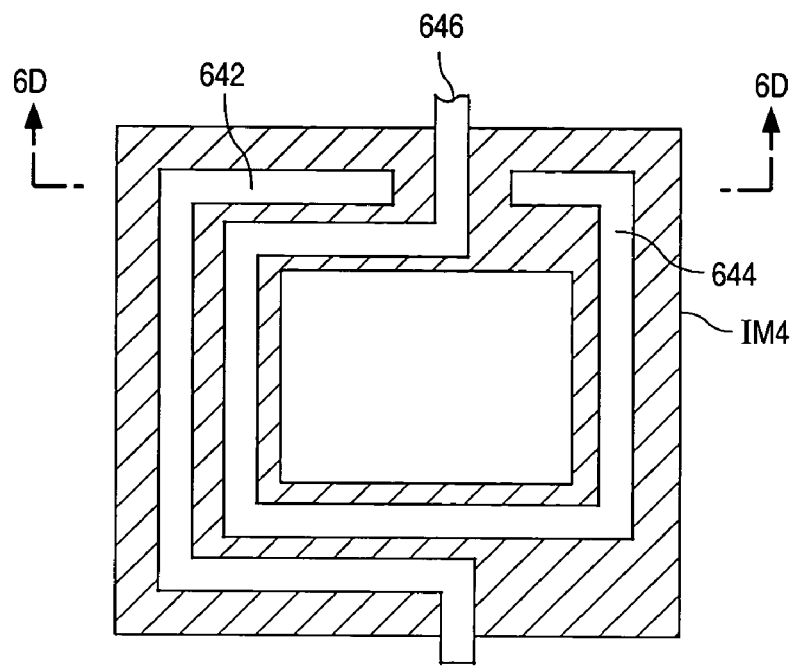
Figure 6D:
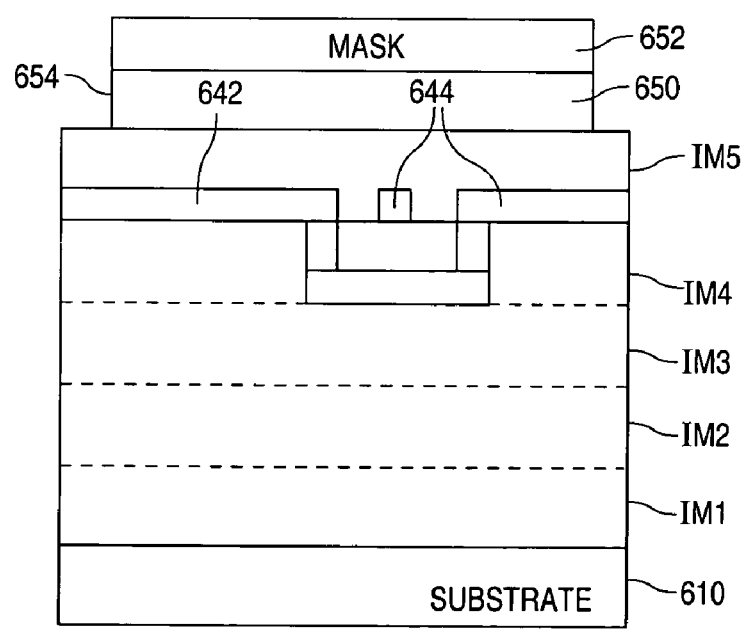

FIG. 6C shows a plan view that illustrates the detector following the etch of the fourth metal layer to form traces 642 and 644. As shown in FIG. 6C, the etch forms an inductor 646. Next, as shown in FIG. 6D, which is a cross-sectional view taken along line 6D—6D of FIG. 6C, a fifth layer of isolation material IM5 is formed on isolation layer IM4 and traces 642 and 644. Following this, a layer of photonic material 650, such a layer of undoped polysilicon, silicon germanium, or damaged single crystal silicon, is formed on the top surface of isolation material IM5. A mask 652 is then formed on the top surface of photonic layer 650.

Following this, the exposed regions of photonic layer 650 are removed to form a photonic region 654. Mask 652 is then removed. Next, a layer of isolation material is formed over isolation layer IM5 and photonic region 654. Following this, the method continues with conventional steps. The above-described steps can be formed by modifying existing masks, and the addition of masking step 652. As a result, the detector can be formed with one additional masking step.

Thus, inductance-based, high-speed photon detectors that can detect gigahertz frequency optical signals, and a method of forming the detectors have been described. It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A photon detector formed on a semiconductor material that has a conductivity type, the photon detector comprising:
   a plurality of layers of isolation material that are formed on the semiconductor material;
   an inductor that is formed in the plurality of isolation layers; and
   a layer of photonic material that is formed on a layer of isolation material, and laterally surrounded by layers of isolation material, the layer of photonic material generating more electron-hole pairs than the surrounding layers of isolation material when struck by light.

2. The photon detector of claim 1 wherein:
   the inductor has a coil; and
   the photonic material is located inside the coil.

3. The photon detector of claim 1 wherein the inductor laterally surrounds the layer of photonic material.

4. The photon detector of claim 1 wherein the layer of photonic material includes polysilicon.

5. The photon detector of claim 4 wherein the layer of photonic material is located vertically between the inductor and a top surface of the semiconductor material.

6. The photon detector of claim 4 wherein the inductor is located vertically between the layer of photonic material and a top surface of the semiconductor material.

7. The photon detector of claim 4 wherein the inductor includes a first metal trace that is formed on one layer of isolation material of the plurality of layers of isolation material.

8. The photon detector of claim 7 wherein the inductor includes:
   first and second vias formed through another layer of isolation material to make an electrical connection with opposite ends of the first metal trace;

a second metal trace formed on said another layer of isolation material to make an electrical connection with the first via; and a third metal trace formed on said another layer of isolation material to make an electrical connection with the second via.

9. The photon detector of claim 8 wherein the polysilicon is undoped.

10. The photon detector of claim 1 wherein the layer of photonic material is silicon germanium.

11. The photon detector of claim 1 wherein the layer of photonic material is damaged silicon.

12. The photon detector of claim 11 wherein:
the inductor has a coil; and
the layer of photonic material is located inside the coil.

13. The photon detector of claim 12 wherein the inductor laterally surrounds the layer of photonic material.

14. A method of detecting light received by a detector, the detector having:

a plurality of layers of isolation material that are formed over a semiconductor material;

an inductor that is formed in the plurality of isolation layers; and a layer of photonic material that is formed on a layer of isolation material, and laterally surrounded by layers of isolation material, the method comprising the steps of:

measuring a first impedance of the inductor when no light strikes the layer of photonic material;

measuring a second impedance of the inductor when ne light strikes the layer of photonic material; and detecting an optical signal by detecting changes in the impedance of the inductor.

15. The method of claim 14 wherein:
the inductor has a coil; and
the layer of photonic material is located inside the coil.

16. The method of claim 14 wherein the inductor laterally surrounds the layer of photonic material.

17. The method of claim 14 wherein the layer of photonic material includes polysilicon.

18. A method of forming an optical detector on a region of semiconductor material that has a conductivity type, the interconnect structure having a plurality of layers of isolation material and an inductor formed in the layers, the inductor having a loop, the method comprising the steps of:

forming a plurality of layers of isolation material;

forming an opening in a layer of isolation material;

filling the opening with a region of photonic material; and forming an inductor in the layers of isolation material.

19. The method of claim 18 wherein the photonic material includes polysilicon and is formed vertically between the inductor and the semiconductor material.

20. The method of claim 18 wherein the inductor has a loop, and the photonic material includes polysilicon that is formed inside the loop.

21. The method of claim 18 wherein the photonic material includes polysilicon, and the inductor is formed vertically between the photonic material and the semiconductor material.

* * * * *